United States Patent
Nishida

(10) Patent No.: US 9,200,964 B2
(45) Date of Patent: Dec. 1, 2015

(54) OPTICAL MODULE AND ATOMIC OSCILLATOR

(71) Applicant: Seiko Epson Corporation, Tokyo (JP)

(72) Inventor: Tetsuo Nishida, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/529,565

(22) Filed: Oct. 31, 2014

(65) Prior Publication Data

US 2015/0123739 A1     May 7, 2015

(30) Foreign Application Priority Data

Nov. 1, 2013    (JP) ................................. 2013-227965

(51) Int. Cl.
| | |
|---|---|
| *H03L 7/26* | (2006.01) |
| *G01J 4/04* | (2006.01) |
| *G01J 1/42* | (2006.01) |
| *G02B 27/28* | (2006.01) |
| *G02B 5/30* | (2006.01) |

(52) U.S. Cl.
CPC ................. *G01J 4/04* (2013.01); *G01J 1/4257* (2013.01); *H03L 7/26* (2013.01); *G02B 5/3083* (2013.01); *G02B 27/286* (2013.01)

(58) Field of Classification Search
CPC ..................................... H03L 7/26; G01J 4/04
USPC ...................................... 331/94.1, 3; 356/364
See application file for complete search history.

(56) References Cited

U.S. PATENT DOCUMENTS

| | | | |
|---|---|---|---|
| 2010/0045956 A1* | 2/2010 | Van De Kerkhof et al. | .... 355/71 |
| 2014/0104008 A1* | 4/2014 | Gan | ............................ 331/94.1 |
| 2015/0091662 A1* | 4/2015 | Yoshida et al. | .............. 331/94.1 |

FOREIGN PATENT DOCUMENTS

| | | |
|---|---|---|
| JP | 2007-336136 A | 12/2007 |
| JP | 2009-089116 A | 4/2009 |
| JP | 2009-164331 A | 7/2009 |
| JP | 2009-188598 A | 8/2009 |
| JP | 2013-098606 A | 5/2013 |

* cited by examiner

*Primary Examiner* — Joseph Chang
(74) *Attorney, Agent, or Firm* — Harness, Dickey & Pierce, P.L.C.

(57) ABSTRACT

An optical module of an atomic oscillator includes: a surface emitting laser adapted to emit light; a depolarization element irradiated with the light emitted from the surface emitting laser, and adapted to dissolve a polarization state of the light irradiated; a polarization element irradiated with light having been transmitted through the depolarization element; a $\lambda/4$ plate irradiated with light having been transmitted through the polarization element, and having a fast axis disposed so as to rotate by 45 degrees with respect to a polarization transmission axis of the polarization element; a gas cell encapsulating an alkali metal gas, and irradiated with light having been transmitted through the $\lambda/4$ plate; and a light detection section adapted to detect intensity of light having been transmitted through the gas cell.

8 Claims, 6 Drawing Sheets

OPTICAL MODULE AND ATOMIC OSCILLATOR

BACKGROUND

1. Technical Field

The present invention relates to an optical module and an atomic oscillator.

2. Related Art

In recent years, an atomic oscillator using coherent population trapping (CPT) as one of quantum interference effects has been proposed, and downsizing and reduction in power consumption of the device have been expected. The atomic oscillator using CPT is an oscillator using an electromagnetically induced transparency phenomenon (EIT phenomenon) that absorption of coherent light beams respectively having two wavelengths (frequencies) different from each other stops if an alkali metal atom is irradiated with the coherent light beams.

For example, in JP-A-2013-98606 (Document 1), there is disclosed an atomic oscillator in which the resonant light emitted from a light source is converted by a λ/4 plate into circularly polarized light, and the gas cell encapsulating the alkali metal atoms is irradiated with the circularly polarized light in order to increasing the occurrence probability of the EIT phenomenon. By irradiating the gas cell with the circularly polarized light, it is possible to cause an interaction between the alkali metal atoms and the circularly polarized light to thereby increase the probability of the alkali metal atoms existing in the ground level of magnetic quantum number $m_F=0$. Thus, the occurrence probability of the EIT phenomenon can be increased.

The light generated in a surface emitting laser has a coherent property, and is therefore suitable for obtaining a quantum interference effect. In general, the surface emitting laser emits polarized light.

However, it is known that in the surface emitting laser, the polarization direction of the polarized light to be emitted changes, namely polarization switching occurs, due to an external factor (e.g., temperature, stress, aging of a device structure). In the single mode VCSEL used for the atomic oscillator, there are normally allowed two polarization directions perpendicular to each other. Therefore, in such a VCSEL, since the polarization direction changes from one of the two directions to the other, namely the polarization direction rotates 90 degrees, due to the polarization switching, it is not achievable to determine the polarization direction of the polarized light to be emitted to one direction.

Therefore, if the vertical cavity surface emitting laser (VCSEL) is applied as a light source of the atomic oscillator of Document 1, the polarization direction of the polarized light to be emitted from the vertical cavity surface emitting laser changes due to the polarization switching, and there is a problem that the polarization direction of the polarized light entering the λ/4 plate changes.

SUMMARY

An advantage of some aspects of the invention is to provide an optical module capable of making the polarization direction of the polarized light entering the λ/4 plate constant even if the polarization direction of the polarized light emitted from the surface emitting laser changes. Another advantage of some aspects of the invention is to provide an atomic oscillator including the optical module described above.

An optical module according to an aspect of the invention is an optical module of an atomic oscillator, including a surface emitting laser adapted to emit light, a depolarization element irradiated with the light emitted from the surface emitting laser, and adapted to dissolve a polarization state of the light irradiated, a polarization element irradiated with light having been transmitted through the depolarization element, a λ/4 plate irradiated with light having been transmitted through the polarization element, and having a fast axis disposed so as to rotate by 45 degrees with respect to a polarization transmission axis of the polarization element, a gas cell encapsulating an alkali metal gas, and irradiated with light having been transmitted through the λ/4 plate, and a light detection section adapted to detect intensity of light having been transmitted through the gas cell.

According to such an optical module, even in the case in which the polarization direction of the polarized light emitted from the surface emitting laser changes, the polarization direction of the polarized light entering the λ/4 plate can be set to a constant direction by the polarization element. Therefore, the rotational direction of the circularly-polarized light with which the gas cell is irradiated can be made constant. Thus, the frequency stability of the atomic oscillator, for example, can be improved.

Further, in such an optical module, by the depolarization element dissolving the polarization state of the light emitted from the surface emitting laser and then making the light enter the polarization element, the variation in the light intensity of the light transmitted through the polarization element can be made small even in the case in which the polarization direction of the polarized light emitted from the surface emitting laser changes. Thus, the variation in the light intensity of the light with which the gas cell is irradiated can be made small to thereby improve the frequency stability of the atomic oscillator.

In the optical module according to the aspect of the invention, the depolarization element may set the light, with which the depolarization element is irradiated, to a polarization state different by a place where the light passes through the depolarization element.

According to such an optical module, the depolarization element can dissolve the polarization state of the light irradiated while making the temporal variation in the light intensity of the light transmitted through the polarization element small.

In the optical module according to the aspect of the invention, the depolarization element may set the light, with which the depolarization element is irradiated, to a polarization state different by time when the light passes through the depolarization element.

According to such an optical module, the depolarization element can dissolve the polarization state of the light irradiated.

In the optical module according to the aspect of the invention, the polarization direction of the light emitted from the surface emitting laser may change from a first direction to a second direction perpendicular to the first direction.

According to such an optical module as described above, the rotational direction and the light intensity of the circularly-polarized light with which the gas cell is irradiated can be made constant even in the case in which the polarization direction of the polarized light emitted by the surface emitting laser changes from the first direction to the second direction.

An atomic oscillator according to another aspect of the invention includes the optical module according to the aspect of the invention.

According to such an atomic oscillator, since the optical module according to the aspect of the invention is included, the rotational direction of the circularly-polarized light with which the gas cell is irradiated can be made constant even in the case in which the polarization direction of the polarized light emitted by the surface emitting laser changes. Thus, the frequency stability, for example, can be improved.

BRIEF DESCRIPTION OF THE DRAWINGS

Embodiments of the invention will be described with reference to the accompanying drawings, wherein like numbers reference like elements.

DESCRIPTION OF AN EXEMPLARY EMBODIMENT

Hereinafter, a preferred embodiment of the invention will be explained in detail with reference to the accompanying drawings. It should be noted that the embodiment described below does not unreasonably limit the contents of the invention as set forth in the appended claims. Further, all of the constituents explained hereinafter are not necessarily essential elements of the invention.

1. Optical Module

Figure 1:
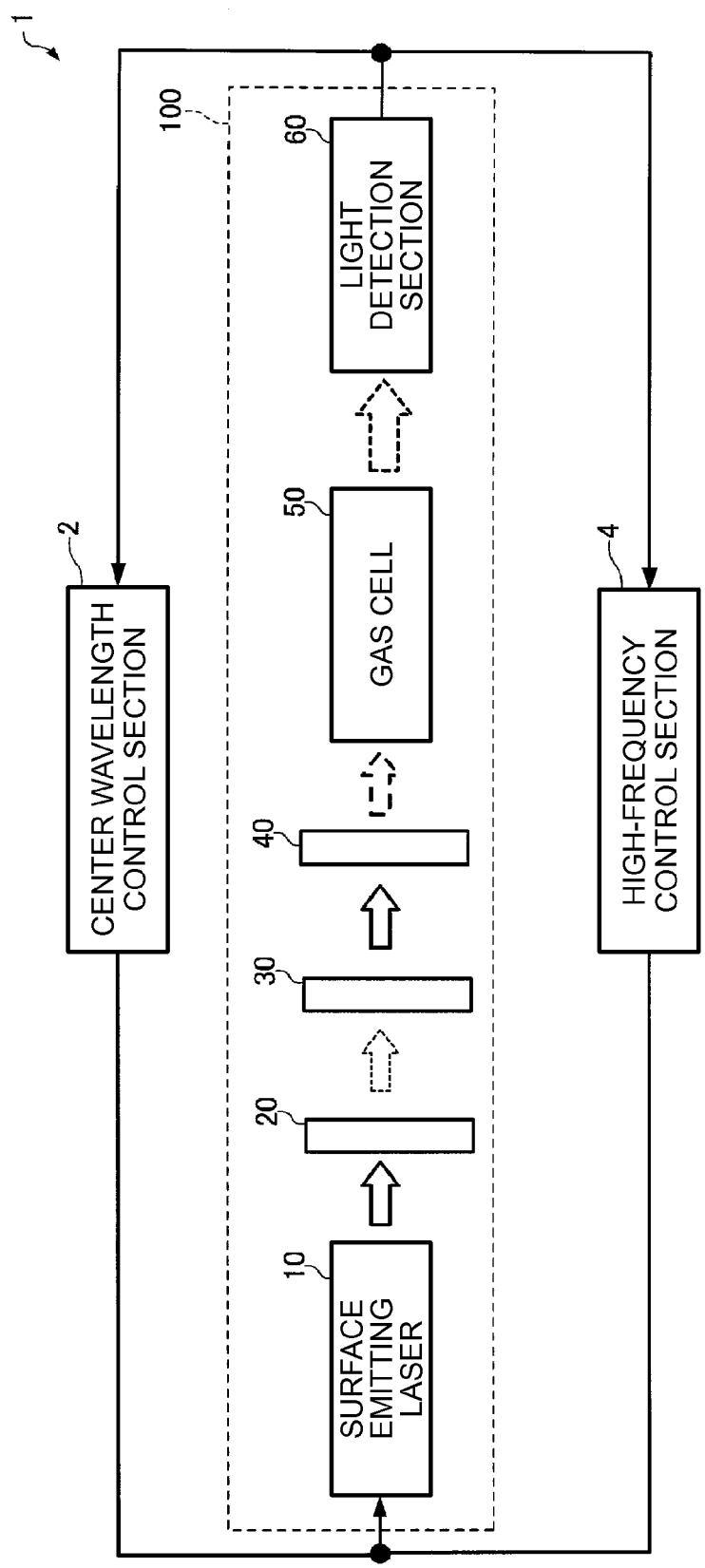
FIG. 1 is a block diagram showing an atomic oscillator including an optical module according to an embodiment of the invention.

Firstly, an optical module according to the present embodiment will be explained with reference to the accompanying drawings. Here, an example of applying the optical module according to the present embodiment to an atomic oscillator will be explained. FIG. 1 is a block diagram showing the atomic oscillator 1 configured including the optical module 100 according to the present embodiment.

As shown in FIG. 1, the atomic oscillator 1 is configured including the optical module 100, a center wavelength control section 2, and a high-frequency control section 4.

As shown in FIG. 1, the optical module 100 is configured including a surface emitting laser 10, a depolarization element 20, a polarization element 30, a λ/4 plate 40, a gas cell 50, and a light detection section 60.

Figure 2:
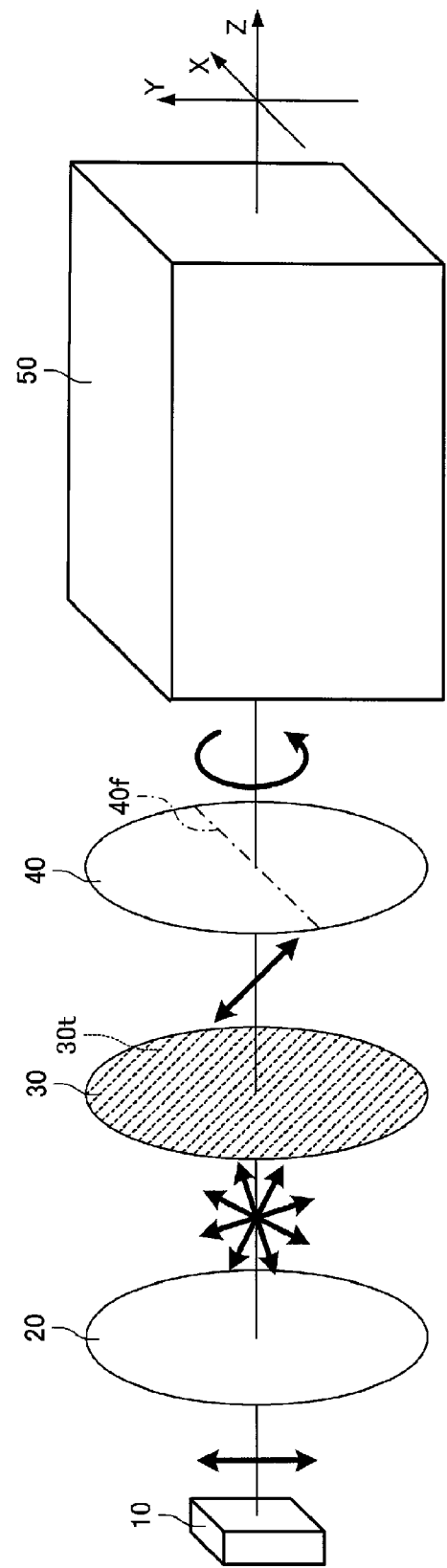
FIG. 2 is a diagram schematically showing the configuration of the optical module according to the embodiment.
Figure 3:
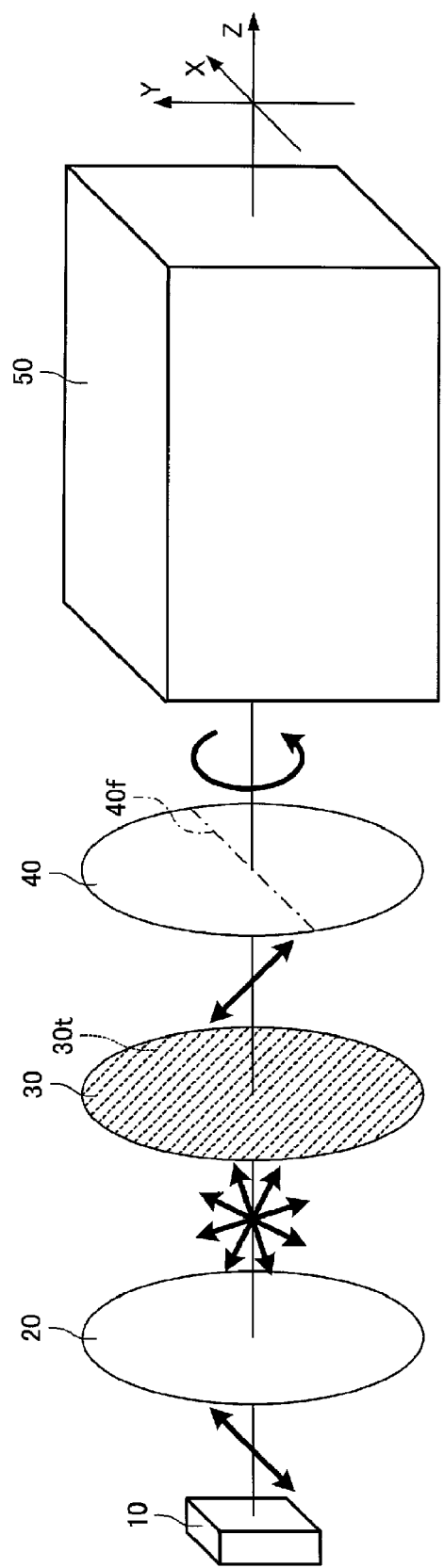
FIG. 3 is a diagram schematically showing the configuration of the optical module according to the embodiment.

FIGS. 2 and 3 are diagrams schematically showing the configuration of the optical module 100. FIG. 2 shows the case in which the polarization direction of the polarized light emitted from the surface emitting laser 10 is the Y direction, and FIG. 3 shows the case in which the polarization direction of the polarized light emitted from the surface emitting laser 10 is the X direction. In FIGS. 2 and 3, the graphical description of the light detection section 60 is omitted for the sake of convenience.

It should be noted that the Z axis is shown in FIGS. 2 and 3 as an axis coinciding with the optical axis of the surface emitting laser 10. Here, the optical axis of the surface emitting laser 10 denotes an axis passing through the center of the spread of the light emitted from the surface emitting laser 10. Further, the X axis and the Y axis are shown in FIGS. 2 and 3 as axes perpendicular to each other, and perpendicular to the Z axis.

The surface emitting laser 10 is, for example, a vertical cavity surface emitting laser (VCSEL) having a resonator configured perpendicularly to a semiconductor substrate. The surface emitting laser 10 is, for example, a single-mode VCSEL.

The surface emitting laser 10 emits the polarized light. Here, the polarized light includes linearly-polarized light and elliptically-polarized light which can substantially be assumed to be linearly-polarized light. The linearly-polarized light denotes the light having the vibration direction of the electric field of the light in a single plane. Further, the elliptically-polarized light which can substantially be assumed to be linearly-polarized light denotes the elliptically-polarized light having the length of the long axis sufficiently long with respect to the length of the short axis. For example, the elliptically-polarized light having the ratio between the length a of the long axis and the length b of the short axis fulfilling the relationship of b/a≤0.1 can be cited. Here, the long axis of the elliptically-polarized light denotes the long axis of an ellipse drawn by a tip of a vibration vector of the electric field of the light in the elliptically-polarized light having the tip of the vibration vector making an elliptic motion. Further, the short axis of the elliptically-polarized light denotes the short axis of such an ellipse. It should be noted that in FIG. 1, the polarized light is represented by a solid outlined arrow, depolarized light is represented by a dotted outlined arrow, and the light (the circularly-polarized light) having the tip of the vibration vector of the electric field making a circular motion is represented by an outlined arrow with a broken line.

In the surface emitting laser 10, the polarized light beams respectively having two directions perpendicular to each other are allowed. Therefore, the polarization direction of the polarized light emitted from the surface emitting laser 10 is either one of the two directions. Here, the polarization direction of the polarized light denotes the vibration direction of the electric field in the linearly-polarized light. Further, the polarization direction of the polarized light denotes the direction of the long axis of the elliptically-polarized light in the elliptically-polarized light which can substantially be assumed to be linearly-polarized light. In the example shown in FIGS. 2 and 3, the polarized light in the X direction (a first direction) and the polarized light in the Y direction (a second direction) are allowed in the surface emitting laser 10, and the polarization direction of the polarized light emitted from the surface emitting laser 10 is one of the X direction and the Y direction.

For example, in the case in which the surface emitting laser 10 uses a (100) GaAs substrate as the semiconductor substrate, the polarized light is allowed in a [011]-axis direction (e.g., the X direction) or in a [0-11]-axis direction (e.g., the Y direction). Therefore, the polarization direction of the polarized light emitted from such a surface emitting laser 10 is either one of the [011]-axis direction and the [0-11]-axis direction.

In the surface emitting laser 10, the polarization switching, in which the polarization direction of the polarized light to be emitted changes, occurs due to an external factor (e.g., temperature, stress, aging of a device structure). In the surface emitting laser 10, the polarization direction changes from one (the first direction) of the two directions in which the polarization is allowed to the other (the second direction) thereof due to the polarization switching. For example, in the surface emitting laser 10, if the polarization switching occurs in the case in which the polarization direction of the polarized light to be emitted is the Y direction (see FIG. 2), the polarization direction of the polarized light to be emitted changes to the X direction (see FIG. 3). Further, in the surface emitting laser 10, if the polarization switching occurs in the case in which the polarization direction of the polarized light to be emitted is the X direction (see FIG. 3), the polarization direction of the polarized light to be emitted changes to the Y direction (see FIG. 2).

For example, in the case in which the surface emitting laser 10 uses the (100) GaAs substrate as the semiconductor substrate, if the polarization switching occurs in the case in which the polarization direction of the polarized light to be emitted from the surface emitting laser 10 is the [011]-axis direction, the polarization direction of the polarized light to be emitted changes to the [0-11]-axis direction. Further, if the polarization switching occurs in the case in which the polarization direction of the polarized light to be emitted from the surface emitting laser 10 is the [0-11]-axis direction, the polarization direction of the polarized light to be emitted changes to the [011]-axis direction.

Figure 4:
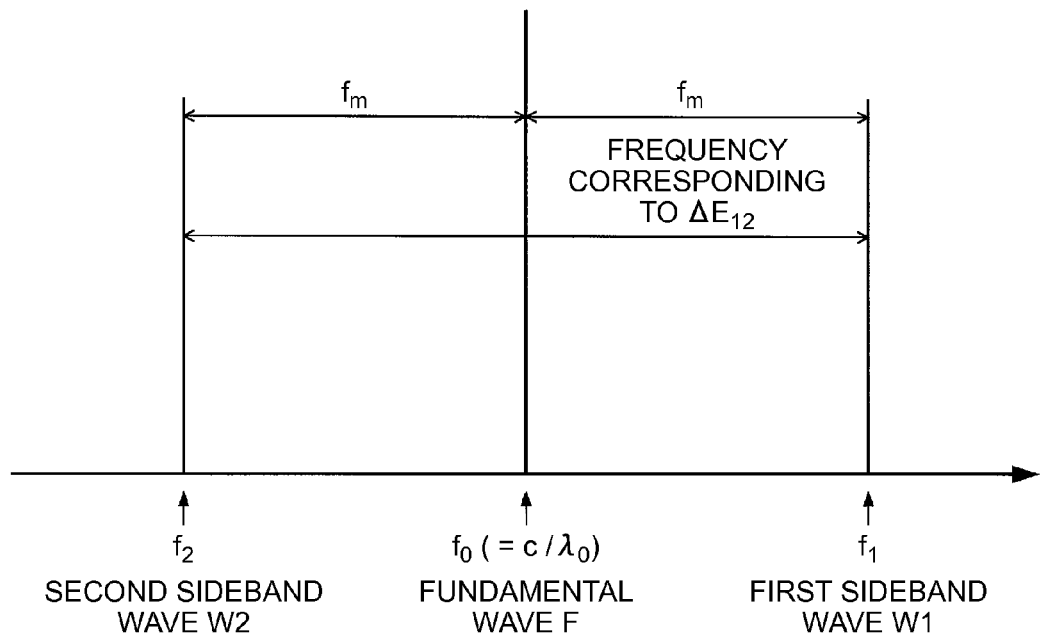
FIG. 4 is a diagram showing a frequency spectrum of resonant light.
Figure 5:
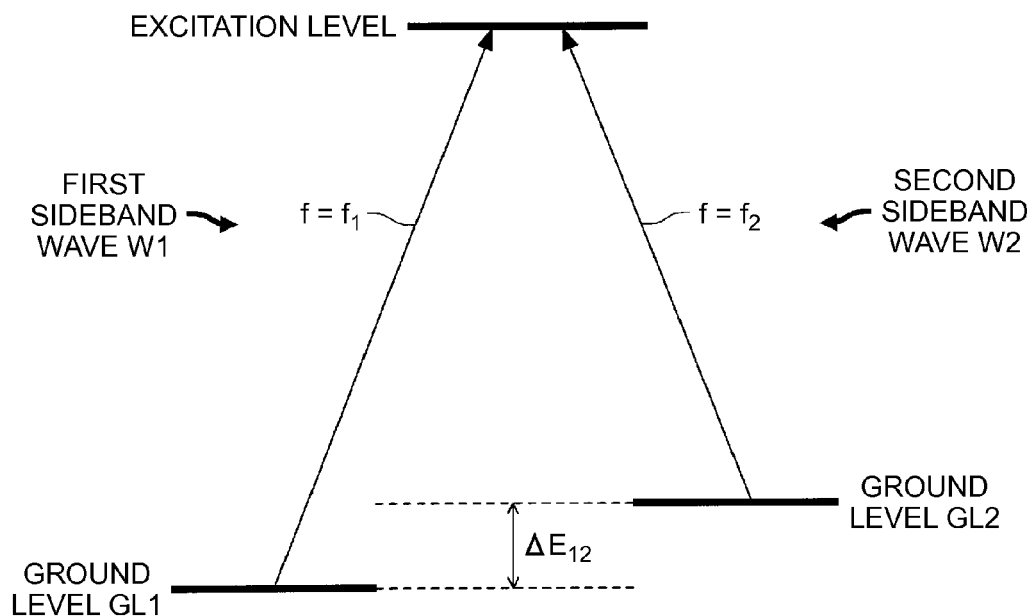
FIG. 5 is a diagram showing a relationship between a Λ-type three-level model of an alkali metal atom, and a first sideband wave and a second sideband wave.

FIG. 4 is a diagram showing a frequency spectrum of the light emitted by the surface emitting laser 10. FIG. 5 is a diagram showing a relationship between a Λ-type three-level model of the alkali metal atom, and a first sideband wave W1 and a second sideband wave W2. The light emitted from the surface emitting laser 10 includes a fundamental wave F having the center frequency $f_0(=c/\lambda_0$: c denotes the speed of light; and $\lambda_0$ denotes the center wavelength of the laser light), the first sideband wave W1 having the frequency $f_1$ in the upper sideband with respect to the center frequency $f_0$, and the second sideband wave W2 having the frequency $f_2$ in the lower sideband with respect to the center frequency $f_0$ shown in FIG. 4. The frequency $f_1$ of the first sideband wave W1 is obtained as $f_1=f_0+f_m$, and the frequency $f_2$ of the second sideband wave W2 is obtained as $f_2=f_0-f_m$.

As shown in FIG. 5, the frequency difference between the frequency $f_1$ of the first sideband wave W1 and the frequency $f_2$ of the second sideband wave W2 coincides with the frequency corresponding to the energy difference $\Delta E_{12}$ between the ground level GL1 and the ground level GL2 of the alkali metal atom. Therefore, the alkali metal atom causes the EIT phenomenon with the first sideband wave W1 having the frequency $f_1$ and the second sideband wave W2 having the frequency $f_2$.

The light emitted from the surface emitting laser 10 enters the depolarization element 20. The depolarization element 20 dissolves the polarization state of the light (the polarized light) emitted from the surface emitting laser 10. Here, dissolving the polarization state of the light (the polarized light) denotes reducing the polarization degree of the polarized light. The polarization degree is an amount representing the degree of the polarization. For example, denoting the intensity of polarized light included in the light by $I_P$, and the intensity of non-polarized light (natural light) by $I_u$, the polarization degree V is obtained as $V=I_P/(I_P+I_u)$. Here, the non-polarized light (the natural light) denotes the light having an even directional distribution when taking an average in a certain period of time although the vibration direction of the electric field of the light is randomly varying. The non-polarized light can be said to be, for example, randomly polarized light (random light).

It is preferable for the depolarization element 20 to dissolve the polarization state of the incident polarized light to decrease the polarization degree to a level equal to or lower than 0.3, for example. More preferably, the depolarization element 20 changes the incident polarized light to non-polarized light (the polarization degree V=0).

In the example shown in FIG. 2, the depolarization element 20 dissolves the polarization of the polarized light polarized in the Y direction to change the polarized light to, for example, non-polarized light. In the example shown in FIG. 3, the depolarization element 20 dissolves the polarization of the polarized light polarized in the X direction to change the polarized light to, for example, non-polarized light.

As described above, even in the case in which the polarization direction of the polarized light emitted from the surface emitting laser 10 rotates by 90 degrees (i.e., the polarization direction changes from the Y direction to the X direction), the polarization is dissolved by the depolarization element 20, and thus, the polarized light changes to the non-polarized light. On this occasion, the light intensity of the light (the non-polarized light) transmitted through the depolarization element 20 becomes the same between the case in which the polarization direction of the polarized light emitted from the surface emitting laser 10 is the Y direction (the case of FIG. 2) and the case in which the polarization direction of the polarized light emitted from the surface emitting laser 10 is the X direction (the case of FIG. 3).

The depolarization element 20 converts the polarized light into the state, in which a variety of polarized light beams are mixed with each other, to thereby dissolve the polarization state of the polarized light. Specifically, for example, the depolarization element 20 sets the light (the polarized light) emitted from the surface emitting laser 10 to the polarization state different by the place where the light passes through the depolarization element 20. In other words, the depolarization element 20 provides the incident polarized light with a spatial phase difference to generate the light in the state in which polarized light beams with a variety of polarization states mixed with each other. Thus, the polarization state of the polarized light can be dissolved. As such a depolarization element 20, there can be used, for example, a depolarization plate obtained by forming an optical crystal such as a quartz crystal having an optical axis to have a wedge shape.

Further, for example, the depolarization element 20 sets the light (the polarized light) emitted from the surface emitting laser 10 to the polarization state different by the time when the light passes through the depolarization element 20. In other words, the depolarization element 20 temporally changes the polarization state of the incident polarized light. Thus, the polarization state of the polarized light can be dissolved. As such a depolarization element 20, there can be used, for example, an element for applying an alternating voltage to a crystal exhibiting an electrooptic effect such as a lithium niobate (LN) crystal to thereby temporally change the polarization direction of the polarized light passing through the crystal to convert the state of the polarized light into the state having a variety of polarized light beams mixed with each other.

It should be noted that although the case of disposing one depolarization element 20 between the surface emitting laser 10 and the polarization element 30 is explained here, it is also possible to dispose a plurality of depolarization elements between the surface emitting laser 10 and the polarization element 30. Thus, the polarization state of the polarized light can further be dissolved.

The light having been transmitted through the depolarization element 20 enters the polarization element 30. In other words, the light (e.g., non-polarized light) dissolved in the polarization state by the depolarization element 20 enters the polarization element 30. The polarization element 30 is a polarization plate for transmitting, for example, only the light polarized in the direction of a polarization transmission axis 30t out of the incident light. Here, the polarization transmission axis 30t denotes an axis for transmitting the vibration of the electric field of the light. The polarization element 30 converts the light dissolved in the polarization state by the depolarization element 20, for example, the non-polarized light into polarized light. On this occasion, the polarization direction of the polarized light to be transmitted through the polarization element 30 is the direction of the polarization transmission axis 30t.

In the example shown in FIGS. 2 and 3, the polarization transmission axis 30t of the polarization element 30 is disposed so as to rotate (be tilted) clockwise by 45 degrees with respect to the Y axis toward the proceeding direction of the light. In other words, the polarization transmission axis 30t of the polarization element 30 is disposed so as to rotate (be tilted) counterclockwise by 45 degrees with respect to the X axis toward the proceeding direction of the light. It should be noted that the direction of the polarization transmission axis 30t of the polarization element 30 is not particularly limited providing the direction is arranged so that the angle with a fast axis 40f of the λ/4 plate 40 described later becomes 45 degrees.

It should be noted that the light intensity of the light having been transmitted through the polarization element 30 is decreased (e.g., roughly ½) compared to the light intensity of the light when entering the polarization element 30. However, the decrease in light intensity in the polarization element 30 does not affect the operation of the atomic oscillator 1.

The λ/4 plate 40 is a wave plate for providing an optical path difference (a phase difference of 90°) of a quarter wavelength between the linearly-polarized light components of the light perpendicular to each other. The λ/4 plate 40 converts the polarized light, which has a direction tilted by 45 degrees with respect to the fast axis 40f as the polarization direction, into circularly-polarized light when the polarized light enters the λ/4 plate 40. Here, the fast axis 40f denotes an axis in a direction along which the λ/4 plate has a low refractive index, and is an axis perpendicular to a slow axis (an axis along which the λ/4 plate has a high refractive index) of the λ/4 plate. As the λ/4 plate 40, for example, a quartz crystal plate or a mica plate can be used.

The λ/4 plate 40 is irradiated with the light having been transmitted through the polarization element 30. In other words, the λ/4 plate 40 is irradiated with the light (the polarized light having the direction of the polarization transmission axis 30t as the polarization direction) polarized in the direction of the polarization transmission axis 30t of the polarization element 30.

The λ/4 plate 40 is disposed so that the fast axis 40f rotates by 45 degrees with respect to the polarization transmission axis 30t of the polarization element 30. In other words, the fast axis 40f of the λ/4 plate 40 is disposed so as to be tilted by 45 degrees around the optical axis with respect to the polarization transmission axis 30t of the polarization element 30. Thus, the polarization direction of the polarized light entering the λ/4 plate 40 has an angle tilted by 45 degrees with respect to the fast axis 40f of the λ/4 plate 40. Therefore, the polarized light (the linearly-polarized light) having entered the λ/4 plate 40 is converted into the circularly-polarized light.

In the example shown in FIGS. 2 and 3, the polarized light, which is polarized in the direction tilted by 45 degrees clockwise with respect to the Y axis (counterclockwise with respect to the X axis) toward the proceeding direction of the polarized light, enters the λ/4 plate 40. The fast axis 40f of the λ/4 plate 40 is disposed in parallel to the X axis. Therefore, the angle of 45 degrees is formed between the fast axis 40f of the λ/4 plate 40 and the polarization direction of the polarized light entering the λ/4 plate 40, and the polarized light having entered is converted by the λ/4 plate 40 into the circularly-polarized light. More specifically, the polarized light having entered the λ/4 plate 40 is converted by the λ/4 plate 40 into the circularly-polarized light having the clockwise rotational direction, namely right circularly-polarized light. Here, the rotational direction of the circularly-polarized light denotes the rotational direction (clockwise, counterclockwise) when viewing a circle drawn by the tip of the vibration vector of the electric field of the light from the proceeding direction of the light in the circularly-polarized light having the tip of the vibration vector making a circular motion. Therefore, the right circularly-polarized light denotes circularly-polarized light having the circle drawn by the tip of the vibration vector of the electric field of the light rotates clockwise viewed from the proceeding direction of the light in the circularly-polarized light having the tip of the vibration vector making a circular motion.

It should be noted that although the case in which the λ/4 plate 40 converts the polarized light having entered the λ/4 plate 40 into the right circularly-polarized light is explained here, it is also possible for the λ/4 plate 40 to convert the polarized light having entered the λ/4 plate 40 into left circularly-polarized light. In other wards, for example, in the example shown in FIGS. 2 and 3, the fast axis 40f of the λ/4 plate 40 can also be disposed in parallel to the Y axis.

The gas cell 50 has the gaseous alkali metal atoms (e.g., sodium atoms, rubidium atoms, or cesium atoms) encapsulated in a container. When the gas cell 50 is irradiated with the two light waves having the difference in frequency (wavelength) corresponding to the energy difference between the two ground levels of the alkali metal atom, the alkali metal atom causes the EIT phenomenon. If, for example, the alkali metal atom is the cesium atom, the frequency corresponding to the energy difference between the ground level GL1 at the D1 line and the ground level GL2 is 9.19263 . . . GHz, and therefore, the EIT phenomenon occurs in response to the irradiation with the two light waves having the frequency difference of 9.19263 . . . GHz.

The gas cell 50 is irradiated with the light (the circularly-polarized light) having been transmitted through the λ/4 plate 40. Thus, the occurrence probability of the EIT phenomenon can be increased. Further, as described above, in the optical module 100, the rotational direction and the light intensity of the circularly-polarized light with which the gas cell 50 is irradiated can be made constant even in the case in which the polarization direction of the polarized light emitted from the surface emitting laser 10 rotates by 90 degrees.

The light detection section 60 detects the intensity of the light transmitted through the alkali metal atom encapsulated in the gas cell 50. The light detection section 60 outputs a detection signal corresponding to the amount of the light having been transmitted through the alkali metal atom. As the light detection section 60, a photo diode, for example is used.

The center wavelength control section 2 generates a drive current having a level corresponding to the detection signal output by the light detection section 60 and then supplies the surface emitting laser 10 with the drive current to thereby control the center wavelength $\lambda_0$ of the light emitted by the surface emitting laser 10. The center wavelength $\lambda_0$ of the light emitted by the surface emitting laser 10 is fine tuned and then stabilized by a feedback loop passing through the surface emitting laser 10, the gas cell 50, the light detection section 60, and the center wavelength control section 2.

The high-frequency control section 4 performs control so that the difference in wavelength (frequency) between the first sideband wave W1 and the second sideband wave W2 becomes equal to the frequency corresponding to the difference in energy between the two ground levels of the alkali metal atom encapsulated in the gas cell 50 based on the detection result output by the light detection section 60. The high-frequency control section 4 generates a modulation signal having a modulation frequency $f_m$ (see FIG. 4) corresponding to the detection result output by the light detection section 60.

The feedback control is performed by the feedback loop passing through the surface emitting laser 10, the gas cell 50, the light detection section 60, and the high-frequency control section 4 so that the frequency difference between the first sideband wave W1 and the second sideband wave W2 coincides with the frequency corresponding to the energy difference between the two ground levels of the alkali metal atom with great accuracy. As a result, since the modulation frequency $f_m$ becomes an extremely stable frequency, the modulation signal can be used as the output signal (clock output) of the atomic oscillator 1.

2. Operation of Optical Module

Then, an operation of the optical module 100 will be explained with reference to FIGS. 1 through 3.

The surface emitting laser 10 emits the polarized light. The polarized light emitted from the surface emitting laser 10 enters the depolarization element 20. The depolarization element 20 dissolves the polarization state of the polarized light emitted from the surface emitting laser 10 to change the polarized light to, for example, non-polarized light. In the optical module 100, the depolarization element changes the polarized light emitted from the surface emitting laser 10 to the light, which is the non-polarized light and has a constant light intensity, even if the polarization direction of the polarized light changes (e.g., rotates by 90 degrees).

The light (the non-polarized light) having been transmitted through the depolarization element 20 enters the polarization element 30. The polarization element 30 converts the incident light (the non-polarized light) into the polarized light polarized in the direction of the polarization transmission axis 30*t*.

The light (polarized light) having been transmitted through the polarization element 30 enters the λ/4 plate 40. The λ/4 plate 40 is disposed so that the fast axis 40*f* rotates by 45 degrees with respect to the polarization transmission axis 30*t* of the polarization element 30. Therefore, the polarized light (the linearly-polarized light) having been transmitted through the λ/4 plate 40 becomes the circularly-polarized light. In the optical module 100, since the polarization direction and the light intensity of the polarized light entering the λ/4 plate 40 can be made constant even in the case in which the polarization direction of the polarized light emitted by the surface emitting laser 10 rotates by 90 degrees, the rotational direction and the light intensity of the circularly-polarized light with which the gas cell 50 is irradiated can be made constant.

The light (the circularly-polarized light) having been transmitted through the λ/4 plate 40 enters the gas cell 50. The light emitted from the surface emitting laser 10 includes the two light waves (the first sideband wave W1 and the second sideband wave W2) having the difference infrequency (wavelength) corresponding to the energy difference between the two ground levels of the alkali metal atom, and the alkali metal atom causes the EIT phenomenon. The intensity of the light having been transmitted through the gas cell 50 is detected by the light detection section 60.

The center wavelength control section 2 and the high-frequency control section 4 perform the feedback control so that the frequency difference between the first sideband wave W1 and the second sideband wave W2 coincides with the frequency corresponding to the energy difference between the two ground levels of the alkali metal atom with great accuracy. In the atomic oscillator 1, by detecting and then controlling the steep variation in the light absorption behavior occurring when the frequency difference $f_1-f_2$ between the first sideband wave W1 and the second sideband wave W2 is shifted from the frequency corresponding to the energy difference $\Delta E_{12}$ between the ground level GL1 and the ground level GL2 using the EIT phenomenon, a highly accurate oscillator can be manufactured.

3. Features of Optical Module

The optical module 100 according to the present embodiment has, for example, the following features.

In the optical module 100, the depolarization element 20 dissolves the polarization state of the light, which is emitted from the surface emitting laser 10, and with which the depolarization element 20 is irradiated, and the polarization element 30 converts the light having been transmitted through the depolarization element 20 into the polarized light, and then make the polarized light enter the λ/4 plate 40. Thus, even in the case in which the polarization direction of the polarized light emitted by the surface emitting laser 10 changes, the polarization direction of the polarized light entering the λ/4 plate 40 can be set to a constant direction. Therefore, the rotational direction of the circularly-polarized light with which the gas cell 50 is irradiated can be made constant. Hereinafter, the advantages will be explained.

Figure 6:
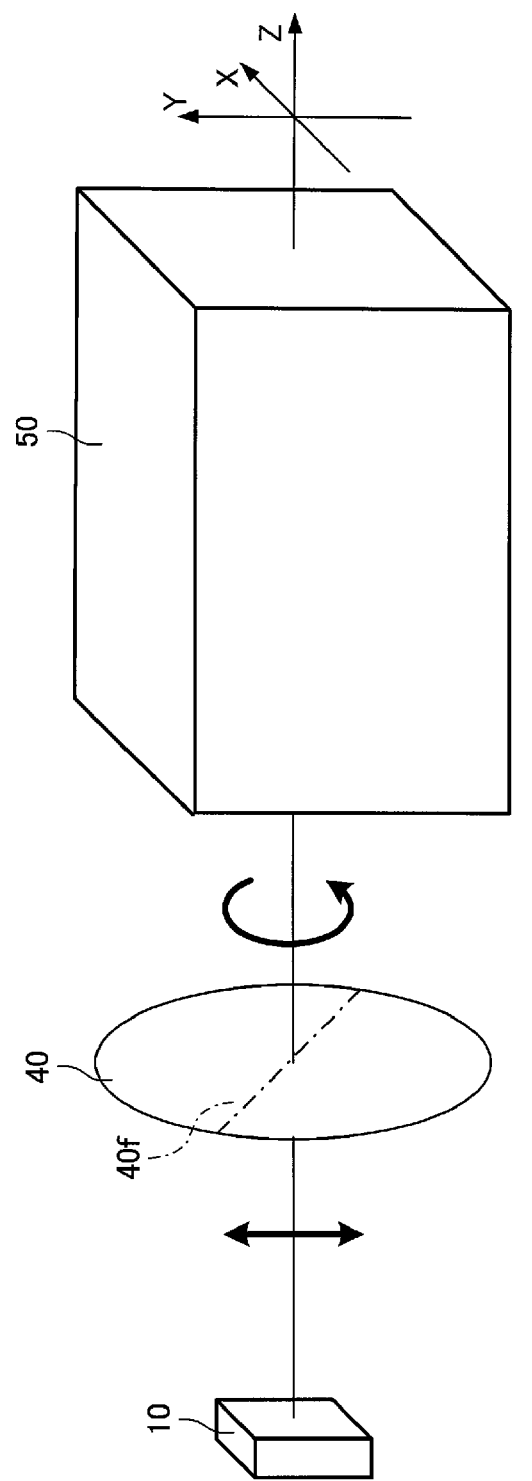
FIG. 6 is a diagram for explaining the configuration of the optical module according to a reference example.
Figure 7:
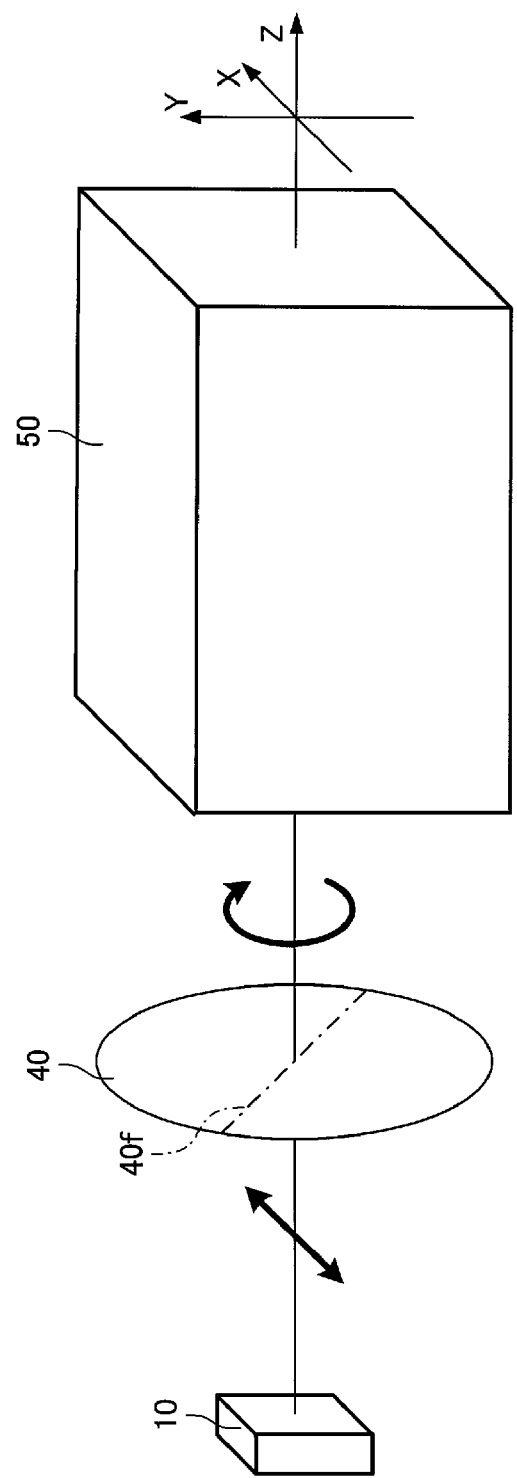
FIG. 7 is a diagram for explaining the configuration of the optical module according to the reference example.

FIGS. 6 and 7 are diagrams for explaining a configuration of an optical module according to a reference example. In the optical module according to the reference example, the depolarization element 20 and the polarization element 30 are not disposed, and the light emitted from the surface emitting laser 10 directly enters the λ/4 plate 40. FIG. 6 shows the case in which the polarization direction of the polarized light emitted from the surface emitting laser 10 is the Y direction, and FIG. 7 shows the case in which the polarization direction of the polarized light emitted from the surface emitting laser 10 is the X direction. It should be noted that the Z axis is shown in FIGS. 6 and 7 as an axis coinciding with the optical axis of the surface emitting laser 10. Further, the X axis and the Y axis are shown as axes perpendicular to each other, and perpendicular to the Z axis.

As shown in FIG. 6, in the case in which the polarization direction of the polarized light emitted from the surface emitting laser 10 is the Y direction, the light having been transmitted through the λ/4 plate 40 becomes the right circularly-polarized light which is the circularly-polarized light having the clockwise rotational direction. Further, as shown in FIG. 7, in the case in which the polarization direction of the polarized light emitted from the surface emitting laser 10 is the X direction, the light having been transmitted through the λ/4 plate 40 becomes the left circularly-polarized light which is the circularly-polarized light having the counterclockwise rotational direction.

As described above, in the optical module according to the reference example, if the polarization direction of the polarized light emitted by the surface emitting laser 10 rotates by 90 degrees, the rotational direction of the circularly-polarized light entering the gas cell 50 changes. If the rotational direction of the circularly-polarized light with which the gas cell 50 is irradiated changes (changes from clockwise to counterclockwise, or changes from counterclockwise to clockwise), the S/N ratio of the EIT signal instantaneously varies due to the variation in population of the alkali metal atom due to the change in the rotational direction of the circularly-polarized light, and thus, the frequency stability of the atomic oscillator is degraded in some cases, for example.

In contrast, according to the optical module 100, the rotational direction of the circularly-polarized light with which the gas cell 50 is irradiated can be made constant even in the case in which the polarization direction of the polarized light emitted from the surface emitting laser 10 changes. Therefore, according to the optical module 100, since the problem described above does not occur, the frequency stability of the atomic oscillator 1 can be improved.

Further, in the optical module 100, by the depolarization element 20 dissolving the polarization state of the light emitted from the surface emitting laser 10 and then making the light enter the polarization element 30, the variation in the light intensity of the light transmitted through the polarization element 30 can be made small even in the case in which the polarization direction of the polarized light emitted from the surface emitting laser 10 changes. In particular, in the case in which the depolarization element 20 dissolves the polarization state of the light emitted from the surface emitting laser 10 to convert the light into non-polarized light, the light intensity of the light transmitted through the polarization element 30 can be made constant even in the case in which the polarization direction of the polarized light emitted from the surface emitting laser 10 changes. Thus, the light intensity of the light, which is transmitted through the λ/4 plate 40, and with which the gas cell 50 is irradiated, can be made constant.

For example, if the light intensity of the light with which the gas cell 50 is irradiated varies, the wavelength (frequency) of the light absorbed by the alkali metal atoms varies due to the AC Stark effect to thereby degrade the frequency stability of the atomic oscillator in some cases.

In the optical module 100, since the variation in the light intensity of the light with which the gas cell 50 is irradiated can be made small (e.g., the light intensity can be made constant) even in the case in which the polarization direction of the polarized light emitted from the surface emitting laser 10 changes, the problem described above does not occur, and thus, the frequency stability of the atomic oscillator 1 can be improved.

As described above, according to the optical module 100, the rotational direction of the circularly-polarized light with which the gas cell 50 is irradiated can be made constant, and the variation in the light intensity thereof can be made small (e.g., the light intensity can be made constant) even in the case in which the polarization direction of the polarized light emitted by the surface emitting laser 10 changes, and thus, the frequency stability of the atomic oscillator 1 can be improved.

In the optical module 100, the depolarization element 20 sets the light (the polarized light) with which the depolarization element 20 is irradiated to the polarization state different by the place where the light passes through the depolarization element 20. Thus, the polarization state of the polarized light irradiated can be dissolved. For example, in the case in which the polarization state of the polarized light is dissolved by setting the light to the polarization state different by the time when the light passes through the depolarization element 20, the light intensity of the light transmitted through the polarization element 30 varies with time, and thus the light intensity of the light with which the gas cell 50 is irradiated varies. In contrast, in the case in which the polarization state of the polarized light is dissolved be setting the light to the polarization state different by the place where the light passes through the depolarization element 20, such a problem does not occur, and the temporal variation in the light intensity of the light transmitted through the polarization element 30 can be made small.

In the optical module 100, the depolarization element 20 sets the light with which the depolarization element 20 is irradiated to the polarization state different by the time when the light passes through the depolarization element 20. Thus, the polarization state of the polarized light irradiated can be dissolved.

It should be noted that the embodiment described above is illustrative only, and the invention is not limited thereto.

Further, for example, although in the above description of the embodiment, there is explained the case in which the fast axis 40f of the λ/4 plate 40 is disposed so as to rotate by 45 degrees with respect to the polarization transmission axis 30t of the polarization element 30, the fast axis 40f of the λ/4 plate 40 can also be disposed so as to rotate within a range of no smaller than 44 degrees and no larger than 46 degrees with respect to the polarization transmission axis 30t of the polarization element 30. In other words, it is also possible for the angle formed between the fast axis 40f of the λ/4 plate 40 and the polarization transmission axis 30t of the polarization element 30 to be within the range of no smaller than 44 degrees and no larger than 46 degrees. Even in such a case, it is possible to obtain the light having been transmitted through the λ/4 plate 40 as the circularly-polarized light or the elliptically-polarized light, which can substantially be assumed to be the circularly-polarized light, and the occurrence probability of the EIT phenomenon can be increased.

The invention includes configurations (e.g., configurations having the same function, the same way, and the same result, or configurations having the same object and the same advantage) substantially the same as the configuration described as the embodiment of the invention. Further, the invention includes configurations obtained by replacing a non-essential part of the configuration described as the embodiment of the invention. Further, the invention includes configurations exerting the same functions and advantages and configurations capable of achieving the same object as the configuration described as the embodiment of the invention. Further, the invention includes configurations obtained by adding known technologies to the configuration described as the embodiment of the invention.

The entire disclosure of Japanese Patent Application No. 2013-227965, filed Nov. 1, 2013 is expressly incorporated by reference herein.

What is claimed is:

1. An optical module of an atomic oscillator, comprising:
 a surface emitting laser adapted to emit light;
 a depolarization element irradiated with the light emitted from the surface emitting laser, and adapted to dissolve a polarization state of the light irradiated;
 a polarization element irradiated with light having been transmitted through the depolarization element;
 a λ/4 plate irradiated with light having been transmitted through the polarization element, and having a fast axis disposed so as to rotate by 45 degrees with respect to a polarization transmission axis of the polarization element;
 a gas cell encapsulating an alkali metal gas, and irradiated with light having been transmitted through the λ/4 plate; and
 a light detection section adapted to detect intensity of light having been transmitted through the gas cell.

2. The optical module according to claim 1, wherein the depolarization element sets the light, with which the depolarization element is irradiated, to a polarization state different by a place where the light passes through the depolarization element.

3. The optical module according to claim 1, wherein
the depolarization element sets the light, with which the depolarization element is irradiated, to a polarization state different by time when the light passes through the depolarization element.

4. The optical module according to claim 1, wherein
the polarization direction of the light emitted from the surface emitting laser changes from a first direction to a second direction perpendicular to the first direction.

5. An atomic oscillator comprising:
the optical module according to claim 1.

6. An atomic oscillator comprising:
the optical module according to claim 2.

7. An atomic oscillator comprising:
the optical module according to claim 3.

8. An atomic oscillator comprising:
the optical module according to claim 4.

* * * * *